United States Patent
Lawandy

(10) Patent No.: US 10,957,141 B2
(45) Date of Patent: Mar. 23, 2021

(54) CODED POLYMER SUBSTRATES FOR BANKNOTE AUTHENTICATION

(71) Applicant: Spectra Systems Corporation, Providence, RI (US)

(72) Inventor: Nabil Lawandy, Saunderstown, RI (US)

(73) Assignee: Spectra Systems Corporation, Providence, RI (US)

( * ) Notice: Subject to any disclaimer, the term of this patent is extended or adjusted under 35 U.S.C. 154(b) by 0 days.

(21) Appl. No.: 16/702,088

(22) Filed: Dec. 3, 2019

(65) Prior Publication Data
US 2020/0105083 A1 Apr. 2, 2020

Related U.S. Application Data

(63) Continuation-in-part of application No. 15/909,170, filed on Mar. 1, 2018.
(Continued)

(51) Int. Cl.
*G07D 7/202* (2016.01)
*G07D 7/1205* (2016.01)
(Continued)

(52) U.S. Cl.
CPC ............ *G07D 7/205* (2013.01); *G07D 7/121* (2013.01); *G07D 7/1205* (2017.05); *B42D 25/29* (2014.10);
(Continued)

(58) Field of Classification Search
CPC ...... B42D 25/29; B42D 25/36; B42D 25/351; G01N 21/31; G01N 21/84; G07D 7/1205;
(Continued)

(56) References Cited

U.S. PATENT DOCUMENTS 5,170,448 A * 12/1992 Ackley .............. G02B 6/12004
                                                    385/131
8,530,863 B2 * 9/2013 Lawandy ............... D21H 21/40
                                                    250/486.1
(Continued)

FOREIGN PATENT DOCUMENTS

EP          2743329 A1      6/2014

OTHER PUBLICATIONS

Extended European Search Report in EP18760973.0 (dated Dec. 3, 2020).

*Primary Examiner* — Violeta A Prieto
(74) *Attorney, Agent, or Firm* — Pryor Cashman LLP

(57) ABSTRACT

A method and system for authenticating an item includes providing the item including a polymer substrate comprising a polymer material and a doping material, the polymer material and the doping material configured to transmit radiation laterally through the polymer substrate, and the doping material capable of scattering radiation and absorbing radiation of at least one specific wavelength to generate a spectral signature in a spectral band of wavelengths of the transmitted radiation, irradiating the item with incident radiation characterized by a spectral band of wavelengths spanning a band of wavelengths including the at least one specific wavelength absorbed and scattered by the doping material, detecting the spectral signature after the radiation is transmitted laterally through the polymer substrate, and determining a code associated with the spectral signature.

24 Claims, 9 Drawing Sheets

Related U.S. Application Data

(60) Provisional application No. 62/465,587, filed on Mar. 1, 2017.

(51) Int. Cl.
*G07D 7/121* (2016.01)
*B42D 25/36* (2014.01)
*B42D 25/29* (2014.01)
*B42D 25/351* (2014.01)

(52) U.S. Cl.
CPC ............ *B42D 25/351* (2014.10); *B42D 25/36* (2014.10); *G07D 2207/00* (2013.01)

(58) Field of Classification Search
CPC ........ G07D 2207/00; G07D 7/10; G07D 7/12; G07D 7/205
See application file for complete search history.

(56) References Cited

U.S. PATENT DOCUMENTS

| | | |
|---|---|---|
| 2005/0018013 A1 | 1/2005 | Nelson et al. |
| 2010/0140501 A1* | 6/2010 | Lawandy ............. G07D 7/1205 250/459.1 |
| 2013/0122266 A1 | 5/2013 | Kane et al. |
| 2016/0102817 A1* | 4/2016 | Leard ........................ F21K 9/64 362/583 |
| 2016/0103065 A1* | 4/2016 | Lee ..................... G02B 6/1226 356/445 |
| 2018/0059018 A1* | 3/2018 | Lee ................... G01N 21/4788 |

* cited by examiner

CODED POLYMER SUBSTRATES FOR BANKNOTE AUTHENTICATION

CROSS-REFERENCE TO RELATED APPLICATIONS

This application is a continuation-in-part of U.S. patent application Ser. No. 15/909,170, filed Mar. 1, 2018, which claims priority to U.S. provisional application Ser. No. 62/465,587, filed Mar. 1, 2017.

TECHNICAL FIELD

The present invention relates generally to apparatus and methods for coding items with polymer substrates including doping materials, the codes being detectable in the form of patterned radiation spectra in response to incident radiation.

BACKGROUND OF THE INVENTION

Counterfeiting is a growing concern and, as a result, secure instruments such as banknotes typically have three levels of authentication. Level I authentication is for public uses and is typically in the form of an optical effect, such as optically variable ink or security threads with optical characteristics that are relatively unique and difficult to duplicate. These Level I authentication features include holographic threads and lenticular lens array security threads. Paper banknotes have included Level I authentication features in the form of watermarks.

Similar to Level I authentication features, Level II authentication features are typically known to the public and commercial banks, and include features such as magnetics and fluorescent and phosphorescent inks, which can be read by simple sensors commonly used in ATMs and bill acceptors.

Level III security features are machine readable features and are more sophisticated than Level II authentication features. Level III security features are typically not known to the public and commercial banks and are used to protect against threats from state-sponsored counterfeiters and other well-funded organizations. The covert Level III authentication features are typically either in the form of inks or other features embedded in the substrate of the banknotes.

Over the last two decades, polymer banknotes have gradually been gaining market share in the banknote industry, with over thirty countries using polymer substrates including materials such as Biaxially Oriented Poly-Propylene (BOPP). The use of polymer substrates has been primarily restricted to lower denominations, as most of the Level III security features that have been employed within paper banknote substrates are not available or suitable for use with polymer banknotes.

The present invention concerns a new Level III security feature in the form of a machine readable technology for use with polymer banknotes.

SUMMARY OF THE INVENTION

In general, in one aspect, the invention features a method for authenticating an item, including providing the item including a polymer substrate comprising a polymer material and a doping material, the polymer material and the doping material configured to transmit radiation laterally through the polymer substrate, and the doping material capable of scattering radiation and absorbing radiation of at least one specific wavelength to generate a spectral signature in a spectral band of wavelengths of the transmitted radiation, irradiating the item with incident radiation characterized by a spectral band of wavelengths spanning a band of wavelengths including the at least one specific wavelength absorbed and scattered by the doping material, detecting the spectral signature after the radiation is transmitted laterally through the polymer substrate, and determining a code associated with the spectral signature.

Implementations of the invention may include one or more of the following features. The doping material may be not matched to the index of refraction of the polymer material, and the polymer substrate may be transparent and colorless. The doping material may be further capable of emitting radiation of a particular wavelength by excitation from the transmitted radiation.

The method may further include comparing the determined code to a reference code and providing an indication of authenticity if the determined code matches the reference code. The spectral signature may be an absorption and scattering pattern in the spectral band of wavelengths of the incident radiation. The spectral band of wavelengths of the incident radiation may include visible light or non-visible electromagnetic radiation.

The polymer material may be biaxially oriented polypropylene. The doping material may be capable of absorbing and scattering radiation at a plurality of specific wavelengths to produce the spectral signature. The absorbed and scattered radiation at the plurality of specific wavelengths may have different intensities at each of the plurality of specific wavelengths. The item may be currency.

The method may further include covering the polymer substrate with an opacity layer. The doping material may be added to the polymer material at 0.01-10% loadings by weight. The polymer material and the doping material may be configured to transmit radiation laterally through the polymer substrate through a wave guided propagation mechanism.

In general, in another aspect, the invention features a system for authenticating an item, including the item including a polymer substrate comprising a polymer material and a doping material, the polymer material and the doping material configured to transmit radiation laterally through the polymer substrate, and the doping material capable of scattering radiation and absorbing radiation of at least one specific wavelength to generate a spectral signature in a spectral band of wavelengths of the transmitted radiation, a radiation source for irradiating the item with incident radiation characterized by a spectral band of wavelengths spanning a band of wavelengths including the at least one specific wavelength absorbed and scattered by the doping material, and a sensor configured to detect the spectral signature after the radiation is transmitted laterally through the polymer substrate.

Implementations of the invention may include one or more of the following features. The doping material may be not matched to the index of refraction of the polymer material, and the polymer substrate may be transparent and colorless. The doping material may be further capable of emitting radiation of a particular wavelength by excitation from the transmitted radiation.

The system may include a computing device for determining a code associated with the spectral signature. The computing device may be configured to compare the determined code to a reference code and to determine whether the item is authentic based on the comparison of the determined code to the reference code. The spectral signature may be an absorption and scattering pattern in the spectral band of wavelengths of the incident radiation. The doping material may capable of absorbing and scattering radiation at a plurality of specific wavelengths to generate the spectral signature, the absorbed and scattered radiation having different intensities at each of the plurality of specific wavelengths, and the sensor configured to detect the intensities at each of the plurality of specific wavelengths in the spectral signature.

The polymer material may be biaxially oriented polypropylene. The item may be currency. The doping material may be added to the polymer material at 0.01-10% loadings by weight. The polymer material and the doping material may be configured to transmit radiation laterally through the polymer substrate through a wave guided propagation mechanism.

DETAILED DESCRIPTION OF THE PREFERRED EMBODIMENTS

Figure 1:
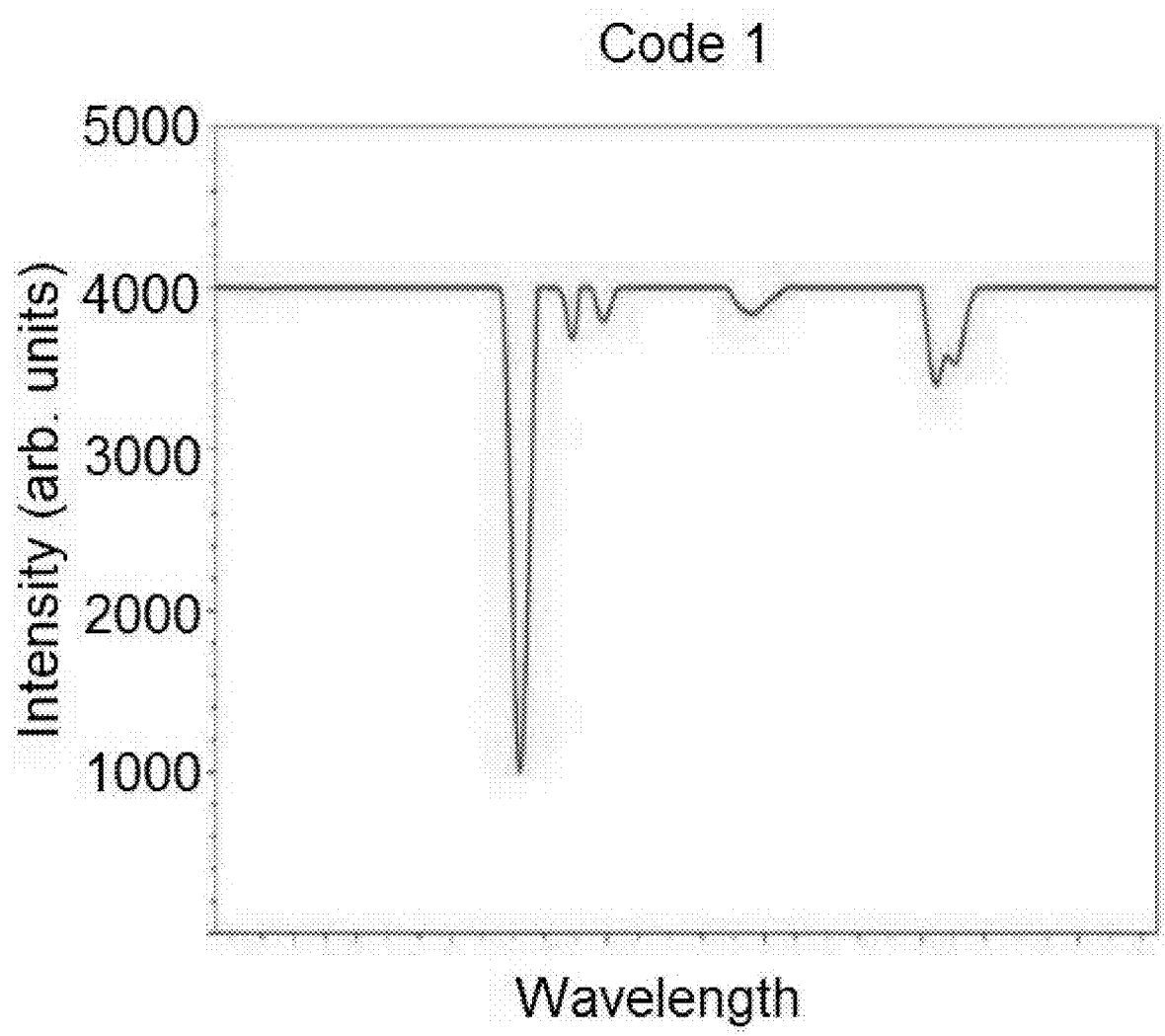
FIG. 1 is a graph showing a first code corresponding to the resulting spectral intensities after a band of incident radiation in the near infrared portion of the electromagnetic spectrum is transmitted through a clear approximately 75 micron polymer layer including doping material.
Figure 2:
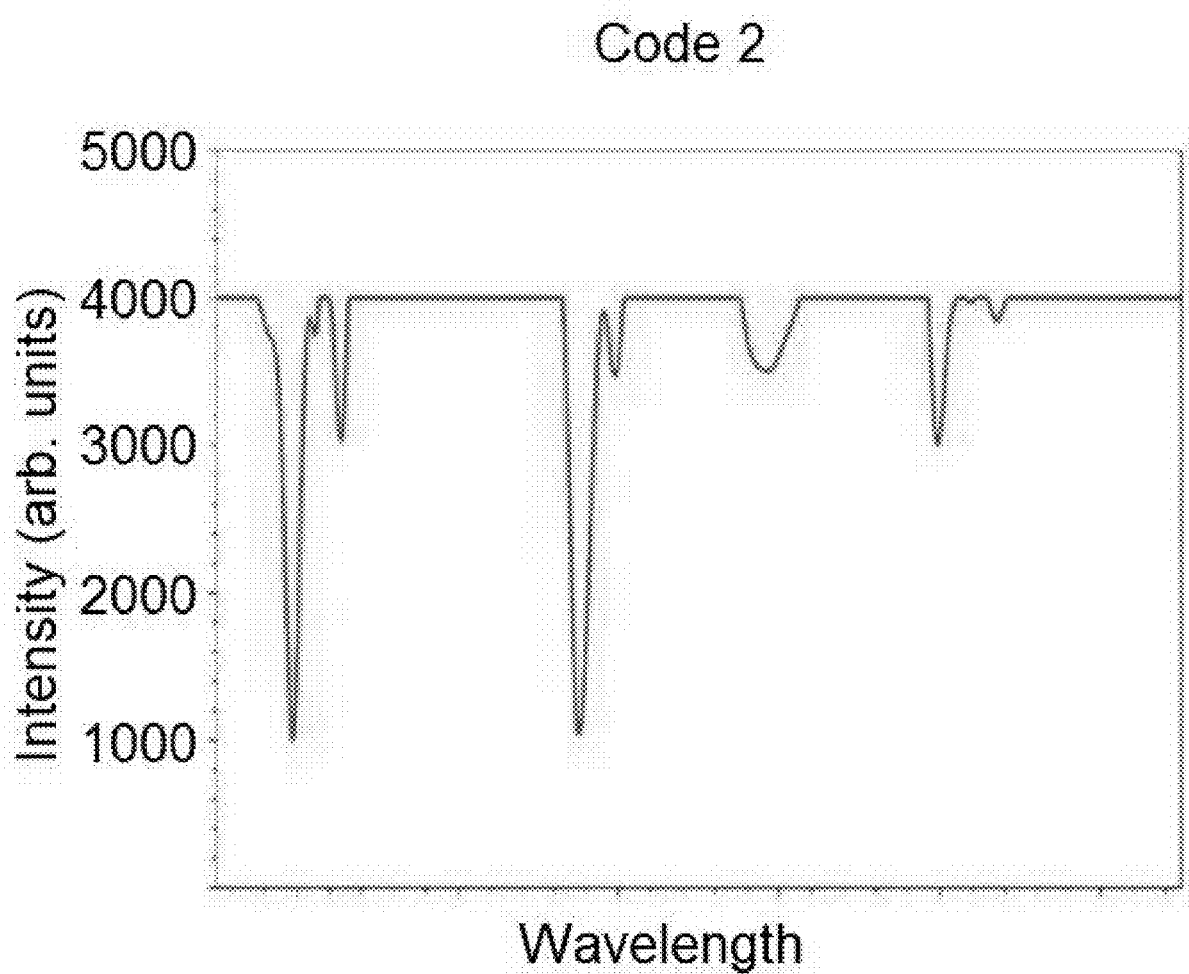
FIG. 2 is a graph showing a second code corresponding to the resulting spectral intensities after a band of incident radiation in the near infrared portion of the electromagnetic spectrum is transmitted through a clear approximately 75 micron polymer layer including doping material.
Figure 3:
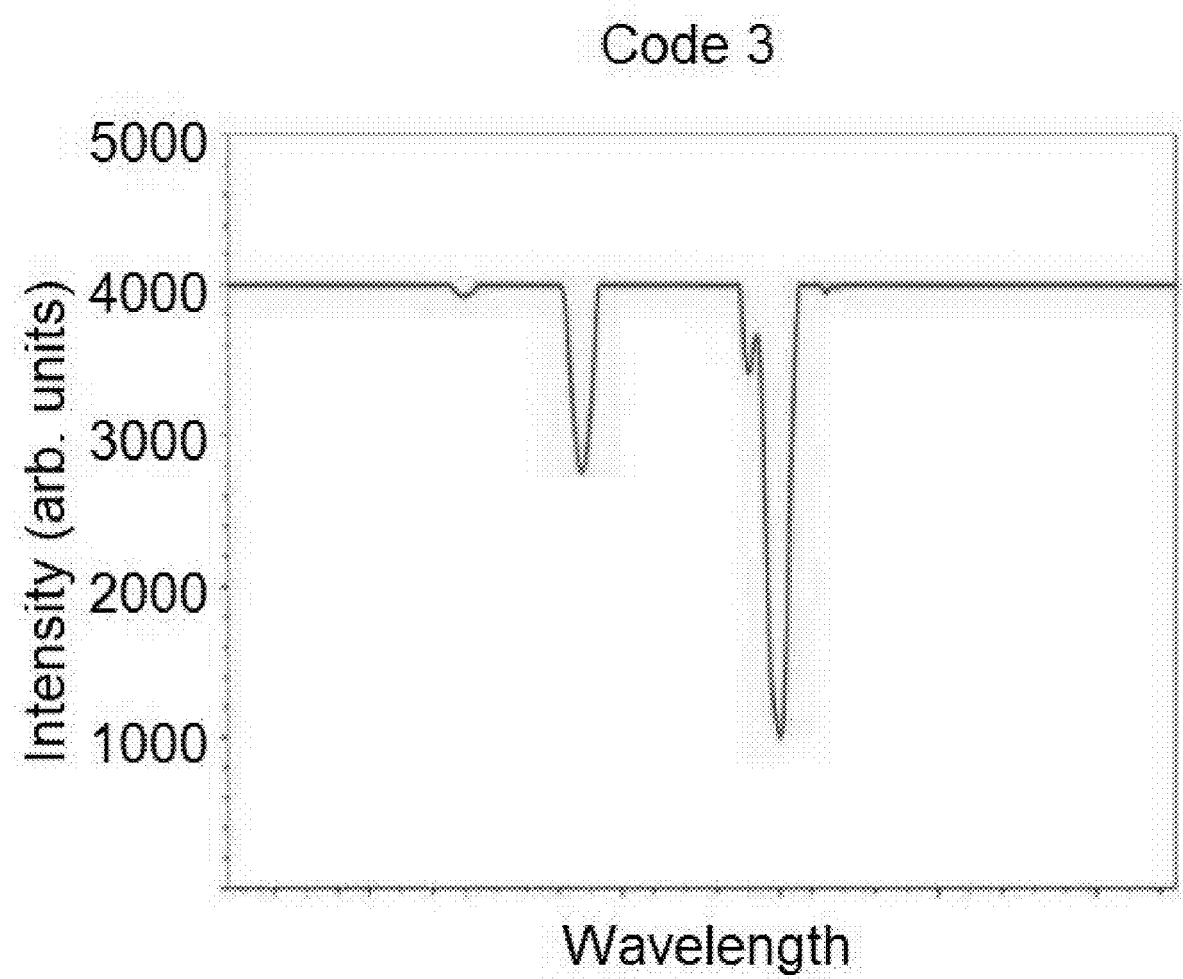
FIG. 3 is a graph showing a third code corresponding to the resulting spectral intensities after a band of incident radiation in the near infrared portion of the electromagnetic spectrum is transmitted through a clear approximately 75 micron polymer layer with doping material.
Figure 4:
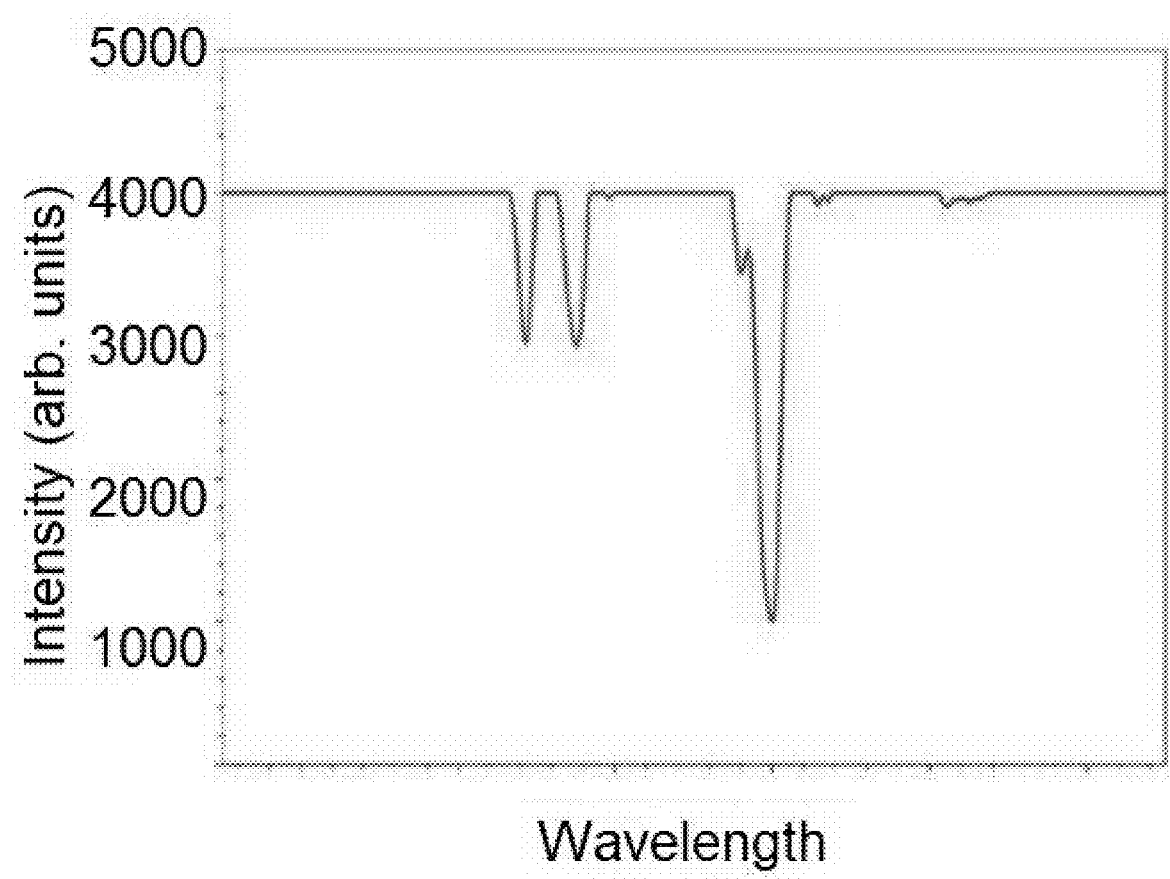
FIG. 4 is a graph showing a fourth code corresponding to the resulting spectral intensities after a band of incident radiation in the near infrared portion of the electromagnetic spectrum is transmitted through a clear approximately 75 micron polymer layer with doping material.

The present invention provides for apparatus and methods for coding polymer substrates with the addition of doping materials, and authentication systems and methods using the coded polymer substrates. The coded polymer substrates may be used, e.g., for authenticating secure items, instruments or documents, such as banknotes or currency.

The substrate may include a transparent and colorless polymer material. The substrate may include a polymer material having an index of refraction between approximately 1.3 and approximately 1.8, compared to the index of refraction of the surrounding medium, i.e., air, of 1.0. A polymer substrate employed in the present invention may be a BOPP layer. Such a BOPP substrate, as used in banknotes or currency, may have a core layer which is approximately 60-90 microns in thickness and top plasma or corona treated skin layers for print adhesion. In one embodiment, the polymer substrate may be covered with an opacity layer to allow for both contrast printing and discharge of static charges. In another embodiment, the polymer substrate may include a clear area or window free from opacity, as is often the case in higher denomination polymer banknotes. The opacity layer of the banknote, either alone or in combination with the area free from opacity, may function as the analog of paper banknote watermark for polymer banknotes.

Doping materials may be nanometer and micrometer materials added to the BOPP material. The doping materials may be added to the BOPP material during extrusion of the polymer layer. The doping materials are selected not to be index matched to allow for scattering of radiation transmitted through the polymer substrate, but at otherwise sufficiently low concentrations to maintain the clarity and transparency of the BOPP material.

The doping materials may be inorganics, organics, semiconductor and nanostructures exhibiting exciton, phonon polariton and plasmonic modes, and particularly those that can survive the extrusion temperatures of the BOPP material or other selected polymer material. The doping materials may be added to or loaded in the BOPP material at 0.01-10% loadings by weight. The quantity of doping material embedded in the polymer material may be so dilute that it does not substantially alter the index of refraction of the polymer material or otherwise render the substrate non-transparent or non-colorless. For example, the particles of the doping material may have a density of less than 900 parts per million. Moreover, the haze of the substrate with the embedded doping material may be less than 5, in which haze refers to the percentage of incident light diffused or scattered when passing through a transparent material.

Most significantly, each doping material exhibits a unique absorptive and/or scattering property or signature in the spectrum of incident radiation transmitted through the BOPP material in the region from the far infrared to the long ultraviolet. In particular, the doping materials selectively absorb and/or scatter incident radiation at specific wavelengths. By combining specific absorption and/or scattering features of various doping materials, codes for authentication of the banknotes are created in the form of patterned spectra with notches or other non-uniform features, i.e., absorption or scattering patterns. In addition, the doping materials may include materials such as phosphors that emit radiation of a particular wavelength, upon excitation by radiation transmitted directly or laterally through the polymer substrate. The emission features of such doping materials may be combined with the absorption and/or scattering features of the doping materials to create patterned spectra for the authentication codes.

Figure 8:
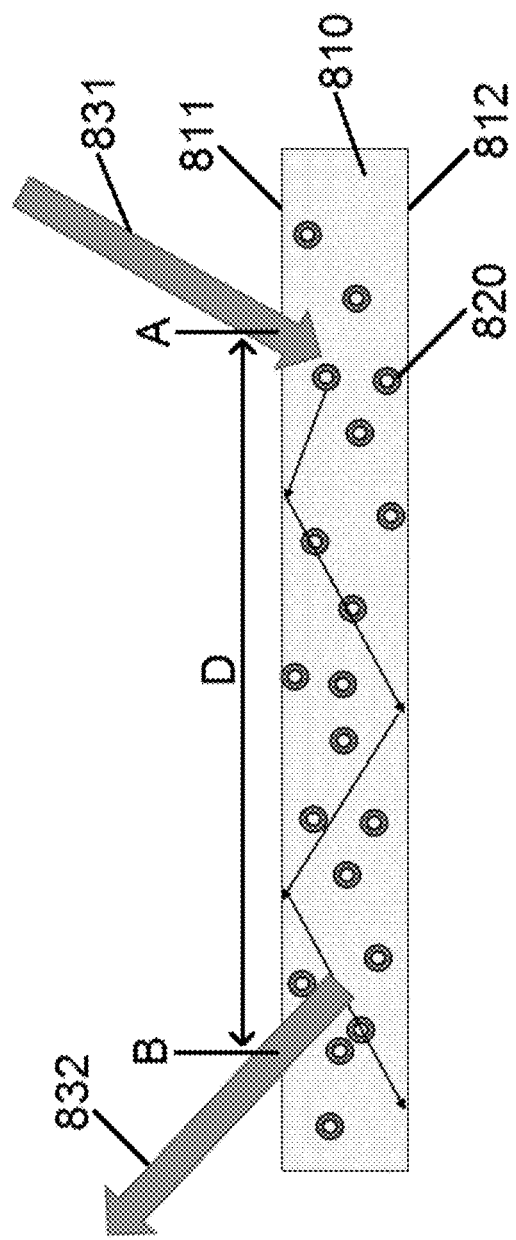
FIG. 8 shows a side view illustration of a substrate of one embodiment of the present invention, the substrate including doping material capable of transmitting incident radiation laterally through the substrate through a wave guided propagation mechanism.

The substrate may have a thickness of approximately 60 microns to approximately 100 microns between an upper surface and a lower surface of the substrate, e.g., between upper surface 811 and lower surface 812 illustrated in FIG. 8. In this case, incident radiation may be transmitted directly through the transparent substrate, i.e., from the lower surface to the upper surface.

The substrate with doping material embedded therein may be configured to function as a waveguide for radiation transmitted through the substrate, i.e., through total internal reflection between the upper and lower surfaces of the substrate. In particular, the substrate is configured as a planar dielectric waveguide capable of transmitting electromagnetic radiation laterally through the substrate in a waveguide mode between the upper and lower surfaces. As shown in FIG. 8, this allows incident radiation 831 coupled to the substrate 810 at a point A to be detected as output light 832 at point B located laterally a distance D from point A. Output light 832 includes a spectral signature. Doping material 820 is disposed through substrate 810, doping material 820 being capable of scattering and/or absorbing radiation.

The incident radiation may enter the substrate for waveguide transmission through external coupling at the upper or lower surface of the substrate followed by internal scattering. Such scattering mediated waveguide coupling is an alternative mode for radiation to enter the planar waveguide of the substrate compared to directing the radiation through an edge of the substrate. The same mode of scattering can result in external coupling and may be used to decouple radiation transmitted through the substrate for detection.

The doping material include particles capable of scattering radiation coupled to the substrate for waveguide mode transmission. In particular, momentum of the incident radiation is conserved such that when radiation strikes the scattering particles, the radiation is launched into a waveguide mode. Utilizing the materials disclosed herein, the radiation may propagate through the substrate a distance ranging from millimeters to centimeters. The path length of radiation propagated through the substrate is determined by the absorptive properties of the doping material embedded in the polymer material. The transmission of radiation in a waveguide mode significantly increases the path length of the radiation through the substrate before the radiation is absorbed by the doping material.

Figure 9:
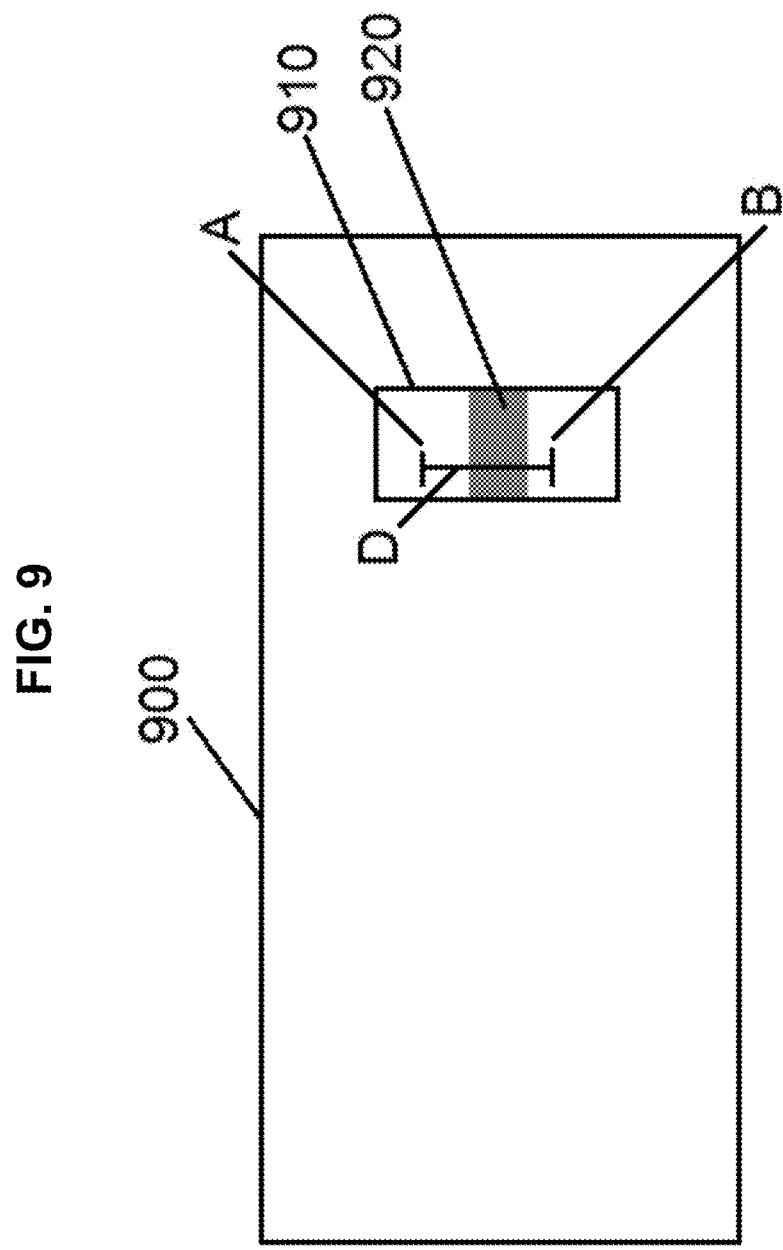
FIG. 9 show a top view illustration of an item of one embodiment of the present invention, the item including a clear window that is partially covered by a foil.

In connection with a process for authenticating an item such as a banknote including a substrate as described herein, the incident radiation may be transmitted through the substrate in a waveguide mode through a clear window of the item, e.g., a clear polymer window in some foreign currency. Alternatively, the incident radiation may be transmitted in a waveguide mode through a portion of the substrate having a metal foil or opacity layer on one or both of the upper and lower surfaces of the substrate. FIG. 9 provides an example including a metal foil or opacity layer. Item 900 includes a clear window 910, in which clear window 910 is partially covered by foil 920. As shown in FIG. 9, incident radiation at illumination point A is detected as output light at detection point B located laterally a distance D from illumination point A. Such illumination, transmission, and detection is possible even with foil 920 separating points A and B using the waveguide process described previously.

Upon detection, i.e., through decoupling from the substrate after waveguide transmission, the spectrum of radiation may be analyzed for patterns such as notches resulting from narrow-band absorption by the doping material.

The process of authenticating an item such as a banknote including a substrate as described herein may be performed using apparatus capable of generating incident radiation for transmission through the substrate and detecting radiation transmitted through the substrate. Such authentication may be performed on high-speed transport mechanisms, such as those used to process currency at a rate of 40 banknotes per second.

FIGS. 1-4 show spectra for a band of incident radiation in the near infrared portion of the electromagnetic spectrum transmitted through a clear approximately 75 micron polymer layer with varying types and levels of doping materials. The intensities of radiation detected after transmission of incident radiation through the polymer layer vary from the otherwise substantially uniform intensity of the incident radiation over the band of wavelengths due to the presence of doping materials. The doping materials are selected to absorb and/or scatter radiation at predetermined wavelengths to create the notched and otherwise non-uniform detected spectral patterns.

Experiments have demonstrated the use of up to ten unique codes embedded in a spectrum of radiation transmitted through a BOPP material that further maintains excellent clarity in regions of the BOPP material lacking an opacity layer and is indistinguishable from un-doped BOPP material. Using shape and Fano resonance effects, metallic and semiconductor nanostructure resonances of doping materials can be tuned and manipulated to create a large array of codes. These codes may be specific to certain institutions, such as Central Banks. The codes may also be used to authenticate banknotes and/or determine the denominations of banknotes on high speed sorting machines, such as those manufactured by Geiseke and Devrient, Cash Processing Solutions (CPS), and Toshiba.

Exemplary embodiments of the present invention are generally directed to devices, apparatus, systems, and methods for authentication using coded polymer substrates. Specifically, exemplary embodiments of the present invention use detecting/sensing mechanisms that may be used to authenticate items including a coded polymer substrate. Although the exemplary embodiments of the present invention are primarily described with respect to authentication and/or preventing counterfeiting, it is not limited thereto, and it should be noted that the exemplary coded polymer substrates may be used to encode other types of information for other applications. Further, the exemplary embodiments of the present invention may be used in conjunction with other authentication measures, e.g., holograms, watermarks, and magnetic encoding.

Figure 5:
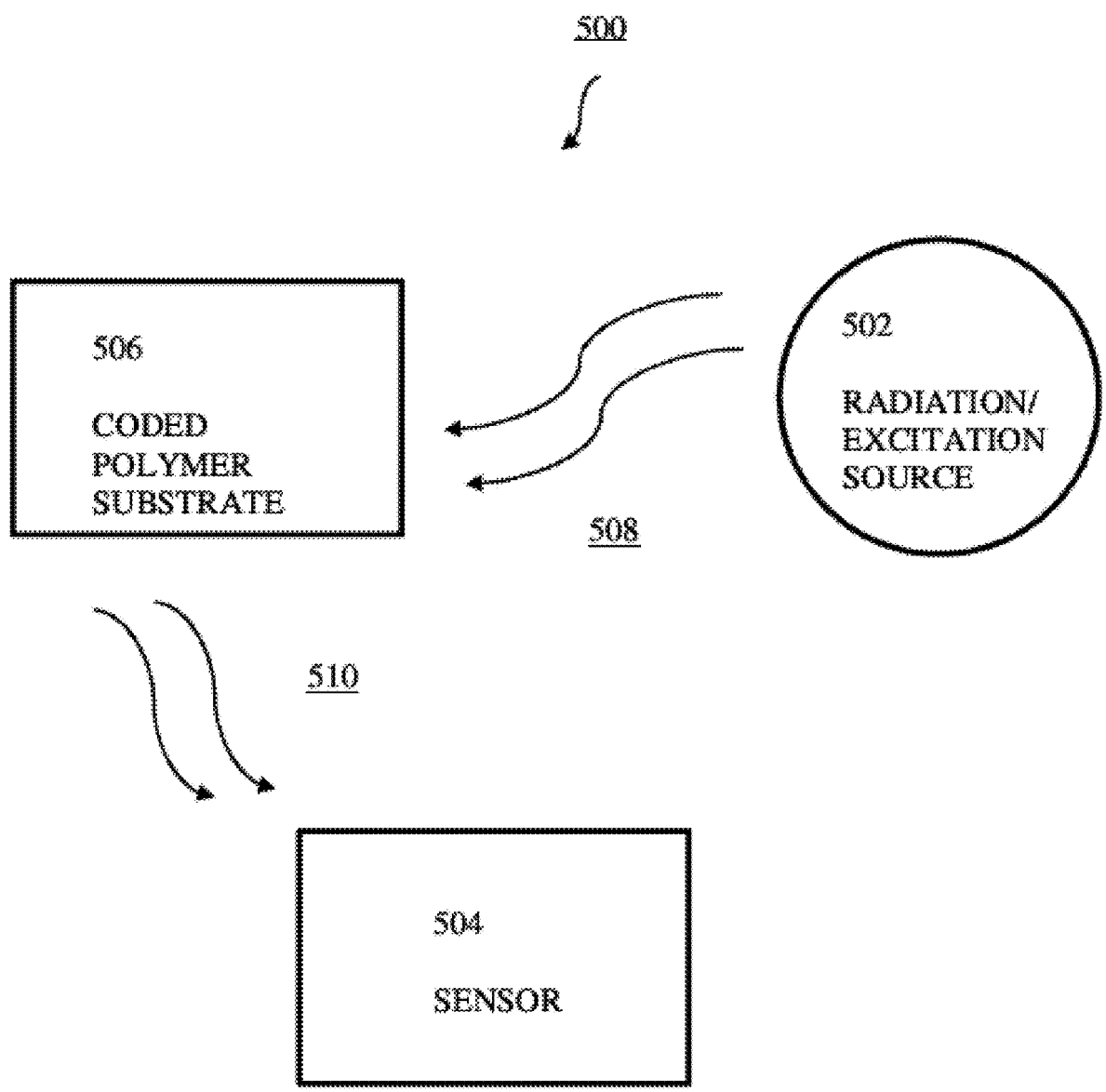
FIG. 5 shows an exemplary authentication system in accordance with embodiments of the invention.

FIG. 5 shows an exemplary system 500 in accordance with embodiments of the present invention. As shown in FIG. 5, system 500 may include a radiation/excitation source 502, a sensor 504, and a coded polymer substrate 506. Radiation/excitation source 502 may be any source supplying radiation 508, such as, e.g., visible light, ultraviolet radiation, radio waves, or microwaves, which is to be transmitted through the coded polymer substrate. Radiation detected after transmission through the coded polymer substrate may include radiation 510 in the same wavelength range or radiation 510 in a different wavelength range.

Sensor 504 may include any detecting, sensing, imaging, or scanning device that is able to receive, image and/or measure the spectrum of the radiation emitted by the coded polymer substrate 504, such as a photometer or a digital camera.

According to certain exemplary embodiments of the present invention, radiation/excitation source 502 may include the flash of a digital camera, and sensor 504 may include the optical components and sensors of the digital camera. In one exemplary embodiment, the radiation/excitation source 502 may include the light source of a smartphone or tablet camera, e.g., Apple iPhone, Apple iPad, Samsung Galaxy or other Android devices, and sensor 504 may include the camera of the smartphone or tablet.

Coded polymer substrate 506 may be included in labels and may be attached or affixed to any product or item, e.g., tax stamps, apparel, currency, or footwear, for which authentication may be desirable.

Figure 6:
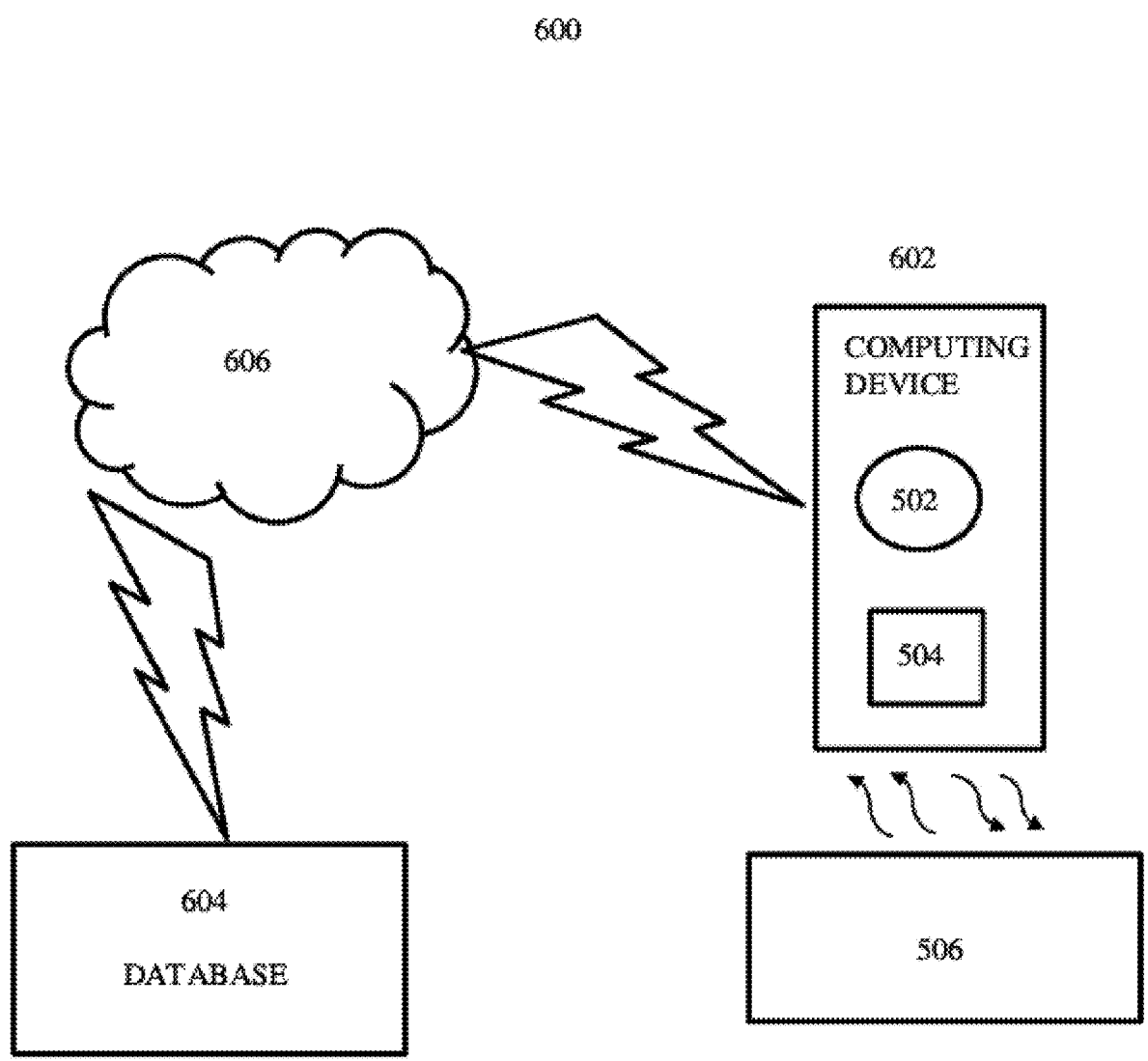
FIG. 6 shows an exemplary system that may be employed to authenticate an item using the method of the present invention.

FIG. 6 shows an exemplary system 600 that may be employed to authenticate an item using the coded polymer substrate described herein. For example, system 600 includes a computing device 602, which may include radiation/excitation source 502 and sensor 504. Computing device 602 may be any computing device that incorporates a radiation/excitation source 502 and sensor 504, such as a smartphone, a tablet, or a personal data assistant (PDA). Alternatively, radiation/excitation source 502 and sensor 504 may be stand-alone devices that operate independent of a computing device. As described herein, the radiation/excitation source 502 may irradiate a coded polymer substrate, and sensor 504 may measure the radiation emitted by the coded polymer substrate, including the spectral signature. The computing device 602 may then determine a code corresponding to the measured spectral signature of the radiation emitted by the coded polymer substrate. The processing of the measured spectral signature to determine the code may be performed by a remote computing device. Subsequently, the code or the measured spectral signature may be compared to a database of reference codes or spectral signatures. The database of reference codes may be stored locally on the scanning, imaging, or sensing device or remotely on a separate computing device.

As shown in FIG. 6, to complete the authentication, the computing device 602 may compare the code or the measured spectral intensities to the reference codes or spectral signature stored in a database 604. Although FIG. 6 illustrates this comparison being performed via a network 606 to a remote database 604, other embodiments contemplate database 604 being local to computing device 602.

Further, in some embodiments, the item being authenticated may include an identifying label, such as, e.g., a barcode, a QR code, or a magnetic code, to enable correlation of the code or the measured spectra to the item being authenticated. In a particular embodiment where computing device 602 is a smartphone or tablet, the transmission via the network 606 may be performed over a cellular data connection or a Wi-Fi connection. Alternatively, this can be performed with a wired connection or any other wired or wireless data transport mechanism.

Figure 7:
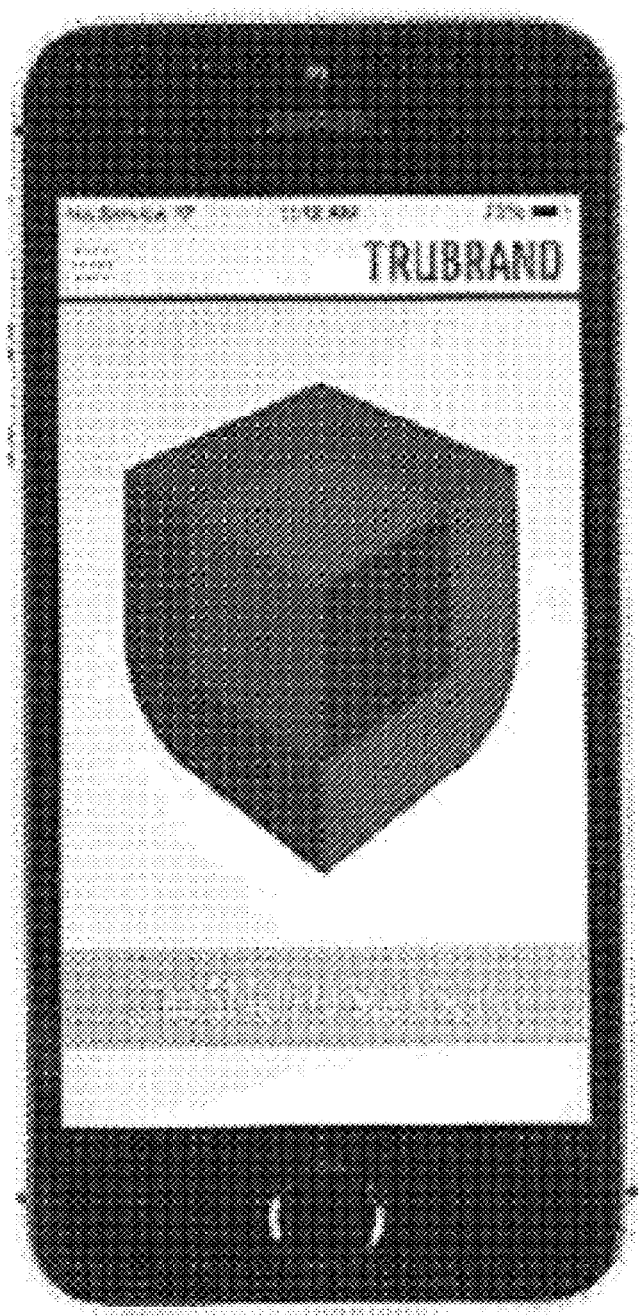
FIG. 7 shows an exemplary screen shot of a software application that may be utilized on a smartphone for authenticating an item in accordance with the present invention.

In certain embodiments of the present invention where a computing device, such as a smartphone or tablet, is utilized for authenticating an item, a software application may be used to simplify the authentication process. FIG. 7 shows a smartphone with an exemplary screen shot of a software application that may be utilized for authenticating an item. The exemplary application may be configured to be executed on any mobile platform, such as Apple's iOS or Google's Android mobile operating system. When the application is run, the software application may provide instructions to a user on properly irradiating or exciting the coded polymer substrate and scanning or imaging the spectrum emitted from the coded polymer substrate. Once the irradiating and scanning of the polymer substrate is complete, the application may facilitate comparison of the measured spectral signature and/or the measured code with a database that stores certain reference codes or spectral signatures to authenticate the item. Further, the application may provide a message or other indicator informing the user of the result of the authentication. For example, the application may provide a text, graphical, or other visual indicator on the screen of the smartphone showing the results of the authentication. Alternatively, the application may provide audible and/or tactile indicators conveying the results of the authentication.

The embodiments and examples above are illustrative, and many variations can be introduced to them without departing from the spirit of the disclosure or from the scope of the appended claims. For example, elements and/or features of different illustrative and exemplary embodiments herein may be combined with each other and/or substituted with each other within the scope of this disclosure. For a better understanding of the invention, its operating advantages and the specific objects attained by its uses, reference should be had to the accompanying drawings and descriptive matter in which there are illustrated exemplary embodiments of the invention.

What is claimed is:

1. A method for authenticating an item, comprising:
   providing the item including a polymer substrate comprising a polymer material and a doping material, the polymer material and the doping material configured to transmit radiation laterally through the polymer substrate through a wave guided propagation mechanism, and the doping material capable of scattering radiation and absorbing radiation of at least one specific wavelength to generate a spectral signature in a spectral band of wavelengths of the transmitted radiation;
   irradiating the item with incident radiation characterized by a spectral band of wavelengths spanning a band of wavelengths including the at least one specific wavelength absorbed and scattered by the doping material;
   detecting the spectral signature after the radiation is transmitted laterally through the polymer substrate through the wave guided propagation mechanism; and
   determining a code associated with the spectral signature.

2. The method of claim 1, wherein the doping material is not matched to the index of refraction of the polymer material, and wherein the polymer substrate is transparent and colorless.

3. The method of claim 1, wherein the doping material is further capable of emitting radiation of a particular wavelength by excitation from the transmitted radiation.

4. The method of claim 1, further comprising
   comparing the determined code to a reference code.

5. The method of claim 4, further comprising
   providing an indication of authenticity if the determined code matches the reference code.

6. The method of claim 1, wherein the spectral signature is an absorption and scattering pattern in the spectral band of wavelengths of the incident radiation.

7. The method of claim 6, wherein the spectral band of wavelengths of the incident radiation includes visible light.

8. The method of claim 6, wherein the spectral band of wavelengths of the incident radiation includes non-visible electromagnetic radiation.

9. The method of claim 1, wherein the polymer material is biaxially oriented poly-propylene.

10. The method of claim 1, wherein the doping material is capable of absorbing and scattering radiation at a plurality of specific wavelengths to produce the spectral signature.

11. The method of claim 10, wherein the absorbed and scattered radiation at the plurality of specific wavelengths has different intensities at each of the plurality of specific wavelengths.

12. The method of claim 1, wherein the item is currency.

13. The method of claim 1, further comprising
    covering the polymer substrate with an opacity layer.

14. The method of claim 1, wherein the doping material is added to the polymer material at 0.01-10% loadings by weight.

15. A system for authenticating an item, comprising:
the item including a polymer substrate comprising a polymer material and a doping material, the polymer material and the doping material configured to transmit radiation laterally through the polymer substrate through a wave guided propagation mechanism, and the doping material capable of scattering radiation and absorbing radiation of at least one specific wavelength to generate a spectral signature in a spectral band of wavelengths of the transmitted radiation;
a radiation source for irradiating the item with incident radiation characterized by a spectral band of wavelengths spanning a band of wavelengths including the at least one specific wavelength absorbed and scattered by the doping material; and
a sensor configured to detect the spectral signature after the radiation is transmitted laterally through the polymer substrate through the wave guided propagation mechanism.

16. The system of claim 15, wherein the doping material is not matched to the index of refraction of the polymer material, and wherein the polymer substrate is transparent and colorless.

17. The system of claim 15, wherein the doping material is further capable of emitting radiation of a particular wavelength by excitation from the transmitted radiation.

18. The system of claim 15, further comprising
a computing device for determining a code associated with the spectral signature.

19. The system of claim 18, wherein the computing device is configured to compare the determined code to a reference code and to determine whether the item is authentic based on the comparison of the determined code to the reference code.

20. The system of claim 15, wherein the spectral signature is an absorption and scattering pattern in the spectral band of wavelengths of the incident radiation.

21. The system of claim 15, wherein the doping material is capable of absorbing and scattering radiation at a plurality of specific wavelengths to generate the spectral signature, the absorbed and scattered radiation having different intensities at each of the plurality of specific wavelengths; and
wherein the sensor is configured to detect the intensities at each of the plurality of specific wavelengths in the spectral signature.

22. The system of claim 15, wherein the polymer material is biaxially oriented poly-propylene.

23. The system of claim 15, wherein the item is currency.

24. The system of claim 15, wherein the doping material is added to the polymer material at 0.01-10% loadings by weight.

* * * * *